United States Patent
Rotstein

(10) Patent No.: US 6,617,174 B2
(45) Date of Patent: Sep. 9, 2003

(54) FIELDLESS CMOS IMAGE SENSOR

(75) Inventor: Israel Rotstein, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/849,000

(22) Filed: May 4, 2001

(65) Prior Publication Data

US 2001/0017367 A1 Aug. 30, 2001

Related U.S. Application Data

(62) Division of application No. 09/328,115, filed on Jun. 8, 1999.

(51) Int. Cl.[7] ............................................. H01L 21/00
(52) U.S. Cl. ...................... 438/7; 438/10; 438/20; 438/22; 438/29; 438/48; 257/69; 257/72; 349/1; 349/42; 349/43
(58) Field of Search .................. 438/7–10, 20, 438/22, 30–32, 149–53, 48, 199–202, 29; 257/72, 69; 349/1, 42, 43

(56) References Cited

U.S. PATENT DOCUMENTS

| 4,074,301 A | 2/1978 | Paivinen et al. ............ 357/23 |
| 4,315,781 A | 2/1982 | Henderson ................ 148/1.5 |
| 5,614,744 A | 3/1997 | Merrill ...................... 257/291 |
| 5,739,562 A | 4/1998 | Ackland et al. ........... 257/291 |
| 5,781,233 A | 7/1998 | Liang et al. ............... 348/302 |
| 5,789,774 A | 8/1998 | Merrill ...................... 257/292 |
| 5,841,158 A | 11/1998 | Merrill ...................... 257/233 |
| 5,841,176 A | 11/1998 | Merrill ...................... 257/446 |
| 6,177,293 B1 | 1/2001 | Netzer et al. ............... 438/73 |

OTHER PUBLICATIONS

Eitan et al.; "Alternate Metal Virtual Ground (AMG)—A New Scaling Concept For Very High–Density EPROM's"; IEEE Electron Devie Letters; vol. 12, No. 8; Aug. 1991; pp. 450–452.

Primary Examiner—Matthew Smith
Assistant Examiner—Granvill D Lee, Jr.
(74) Attorney, Agent, or Firm—Bever Hoffman & Harms, LLP; Patrick T. Bever

(57) ABSTRACT

A fieldless CMOS image sensor that include a non-LOCOS isolation structure surrounding the photodiode diffusion region of each pixel. The isolation structure is formed by an anti-punchthrough (APT) implant isolation region formed in the substrate around the photodiode diffusion region, and spacer oxide that is formed using a special mask to cover the APT implant region. The APT implant isolation region is self-aligned with the special spacer oxide mask. A width of the isolation structure between two adjacent photodiodes is 0.5 μm or more. Similarly, LOCOS structures that are used, for example, in the image sensor active circuitry, are separated from the image-sensing (e.g., photodiode) region of each pixel by portions of the isolation structure having a width of 0.5 μm or more.

9 Claims, 11 Drawing Sheets

FIELDLESS CMOS IMAGE SENSOR

FIELD OF THE INVENTION

The present invention relates to CMOS image sensors. More specifically, the present invention relates to CMOS active pixel sensors without field oxide isolation around the photodiode diffusion region of each pixel.

RELATED ART

Solid state image sensors used in, for example, video cameras are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a cathode-ray tube (CRT) display.

CMOS image sensors first appeared in 1967. However, CCDs have prevailed since their invention in 1970. Both solid-state imaging sensors depend on the photovoltaic response that results when silicon is exposed to light. Photons in the visible and near-IR regions of the spectrum have sufficient energy to break covalent bonds in silicon. The number of electrons released is proportional to the light intensity. Even though both technologies use the same physical properties, all-analog CCDs dominate vision applications because of their superior dynamic range, low fixed-pattern noise (FPN), and high sensitivity to light.

More recently, however, CMOS image sensors have gained in popularity. Pure CMOS image sensors have benefited from advances in CMOS technology for microprocessors and ASICs and provide several advantages over CCD imagers. Shrinking lithography and advanced signal-processing algorithms set the stage for sensor array, array control, and image processing on one chip produced using these well-established CMOS techniques. Shrinking lithography should also decrease image-array cost due to smaller pixels. However, pixels cannot shrink too much, or they have an insufficient light-sensitive area. Nonetheless, shrinking lithography provides reduced metal-line widths that connect transistors and buses in the array. This reduction of metal-line widths exposes more silicon to light, thereby increasing light sensitivity. CMOS image sensors also provide greater power savings because they require fewer power-supply voltages than do CCD imagers. In addition, due to modifications to CMOS pixels, newly developed CMOS image sensors provide high-resolution, low-noise images that are comparable with CCD imager quality.

CMOS pixel arrays are at the heart of the newly developed CMOS image sensors. CMOS pixel-array construction uses active or passive pixels.

Each pixel of a passive pixel array includes a photodiode for converting photon energy to free electrons, and an access transistor for selectively connecting the photodiode to a column bus. However, high read noise for passive pixels limit the passive pixel array's size. Further, the turn-on thresholds for the access transistors of the various pixels varies throughout the passive pixel array, thereby giving non-uniform response to identical light levels.

CMOS active-pixel sensors (APSs) overcome passive-pixel deficiencies by including active circuits (transistors) in each pixel. In one example, these active circuits include a source-follower transistor, a reset transistor and a row-selection transistor. The source-follower transistor buffers the charge transferred to an output (column) bus from the light sensing element (i.e., photodiode or photogate), and provides current to quickly charge and discharge the bus capacitance. The faster charging and discharging allow the bus length to increase. This increased bus length, in turn, allows an increase in the array size. The reset transistor controls integration time and, therefore, provides for electronic shutter control. The row-select transistor gives half the coordinate readout capability to the array. Although these transistors would appear to increase the device's power consumption, little difference exists between an active and a passive pixel's power consumption.

FIG. 1 shows a conventional CMOS APS that includes a pixel array 10, a row decoder 20 and a plurality of column data (bus) lines 30. Pixel array 10 includes closely spaced APS cells (pixels) 100 that are arranged in rows and columns. Pixel array 10 is depicted as a ten-by-ten array for illustrative purposes only. Pixel arrays typically consist of a much larger number of pixels (e.g., 1280-by-1024 arrays).

Each APS cell 100 of pixel array 10 includes a light sensing element and the active circuits described above. The light sensing element is capable of converting a detected quantity of light into a corresponding electrical signal at an output terminal 50. The active circuits of pixels in each row are connected to a common reset control line 23 and a common row select control line 27. The active circuits of the pixels in each column are connected through respective output terminals 50 to common column data lines 30.

In operation, a timing controller (not shown) provides timing signals to row decoder 20 that sequentially activates each row of APS cells 100 using control signals transmitted via reset control lines 23 and row select control lines 27 to detect light intensity and to generate corresponding output voltage signals during each frame interval. A frame, as used herein, refers to a single complete cycle of activating and sensing the output from each APS cell 100 in the array over a predetermined frame time period. The timing of the imaging system is controlled to achieve a desired frame rate, such as 30 frames per second. The detailed circuitry of the row decoder 20 is well known to one of ordinary skill in the art of CMOS APS production.

When detecting a particular frame, each row of pixels may be activated to detect light intensity over a substantial portion of the frame interval. In the time remaining after the row of APS cells 100 has detected the light intensity for the frame, each of the respective pixels simultaneously generates output voltage signals corresponding to the amount of light detected by that APS cell 100. If an image is focused on the array 10 by, for example, a conventional camera lens, then each APS cell 100 generates an output voltage signal corresponding to the light intensity for a portion of the image focused on that APS cell 100. The output voltage signals generated by the activated row are simultaneously provided to the column output line 30 via output terminals 50.

FIGS. 2(A) and 2(B) are plan and cross-sectional side views, respectively, showing a portion of a conventional CMOS APS cell 100. Referring to FIG. 2(B), which is a cross-sectional side view taken along line 2B—2B of FIG. 2(A), conventional CMOS APS cell 100 includes a photodiode region 102 having a peripheral edge that is surrounded by field oxide 104. An interface 106 is defined along the abutting peripheral edges of photodiode region 102 and field oxide 104. In addition, a reset gate 107 is located over a channel 103 provided between a source region 108 and a drain region 109. Reset gate 107 controls charging and discharging of photodiode region 102 via source region 108, which extends from photodiode region 102, in the manner described above.

Based on conventional practices, the fabrication of CMOS APS cell 100 begins by growing field oxide 104 using the well-known LOCOS (LOCal Oxidation of Silicon) process to isolate photodiode region 102 from currents generated in surrounding pixels. Next, polysilicon is deposited and patterned to form reset gate 107. Reset gate 107 and field oxide 104 are then used to form lightly-doped drain (LDD) regions in source region 108 and drain region 109. Next, sidewall spacers, such as sidewall spacer 110 shown in FIG. 2(B), are formed using a plasma oxide etch process. Finally, photodiode region 102, source region 108 and drain region 109 are heavily (n+) doped, and metal contacts (not shown) are provided to, for example, connect a reset control line 23 (see FIG. 1) to reset gate 107.

A problem associated with conventional CMOS APSs is that growth of field oxide using LOCOS processes induces mechanical stress at the field oxide's bird's beak region. Therefore, conventional CMOS APS pixel arrays often experience white spots in the image generated by a CMOS APS.

What is needed is a method for fabricating pixel sensor structures that minimizes the occurrence of white spots on images produced by CMOS image sensors without reduction of the fill factor of CMOS APS pixel arrays.

SUMMARY

The present inventors have determined that a significant cause of white spot problems in CMOS image sensors is excessive current leakage from the light-sensitive (e.g., photodiode) regions. In particular, this excessive current leakage appears to occur at the interface between the photodiode diffusion region and the surrounding field oxide. These interface regions are subjected to excessive mechanical stress and damage during the LOCOS process used to form the field oxide, and to excessive electrical stress during device operation. These mechanical and electrical stresses are believed to be the primary cause of excessive leakage current that results in white spots.

Accordingly, the present invention provides a fieldless CMOS image sensor and methods for producing the fieldless CMOS image sensor that utilize field isolation materials other than LOCOS-based field oxide around the peripheral edge of the photodiode diffusion region. By eliminating LOCOS-based field oxide from the peripheral edge of the light sensitive regions, the stress/damage produced in prior art image sensors is avoided. Therefore, leakage current from the light sensitive regions is reduced, and the occurrence of white spots is minimized.

In accordance with an embodiment of the present invention, a fieldless CMOS image sensor includes at least one pixel that has an image-sensing region having a peripheral edge and an isolation structure formed around the image-sensing region that includes spacer oxide structures located over an anti-punchthrough (APT) implant (which includes a conventional anti-punchthrough implant, a threshold voltage adjust implant and a PLDD implant). The spacer oxide structures are formed from a spacer oxide layer using a special blocking mask. The spacer oxide structures are utilized to shield the APT implant regions during heavy doping of the image-sensing region. Consequently, the stress/damage produced in the conventional CMOS APS cell is avoided using an economical process that requires only one additional mask.

The present invention will be more fully understood in view of the following description and drawings.

DETAILED DESCRIPTION

The present inventor has determined that a significant cause of white spots in conventional CMOS image sensors is due to high current leakage from the light sensitive (e.g., photodiode) regions of the pixels in regions of the field oxide surrounding each photodiode. These field oxide regions are formed using LOCOS processes that subject the surrounding silicon to excessive mechanical stress during fabrication, and cause excessive electrical stress during device operation. These mechanical and electrical stresses are believed to be the primary cause of excessive leakage current that results in white spots.

Figure 1:
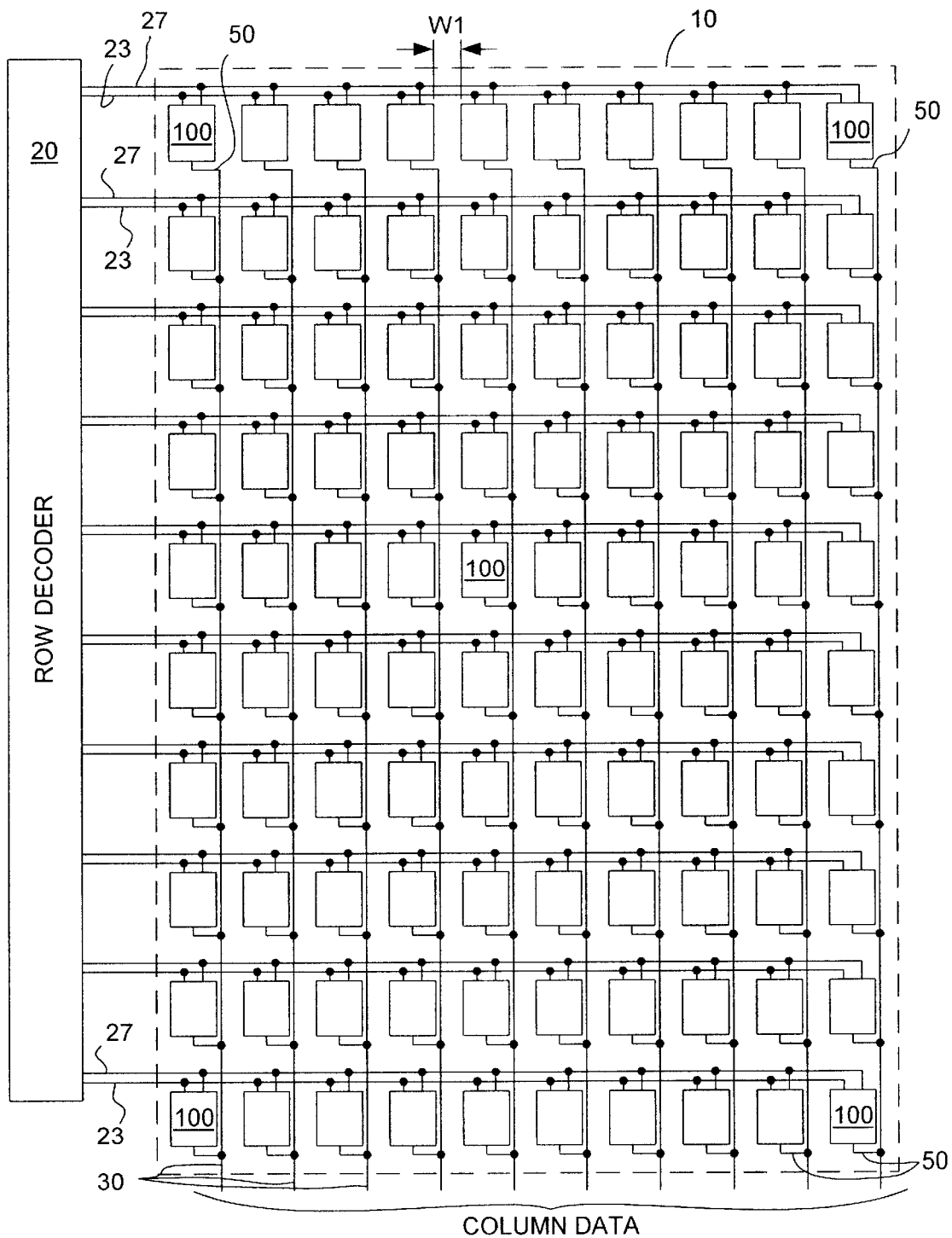
FIG. 1 is a simplified circuit diagram showing a conventional CMOS APS circuit.
Figure 2A:
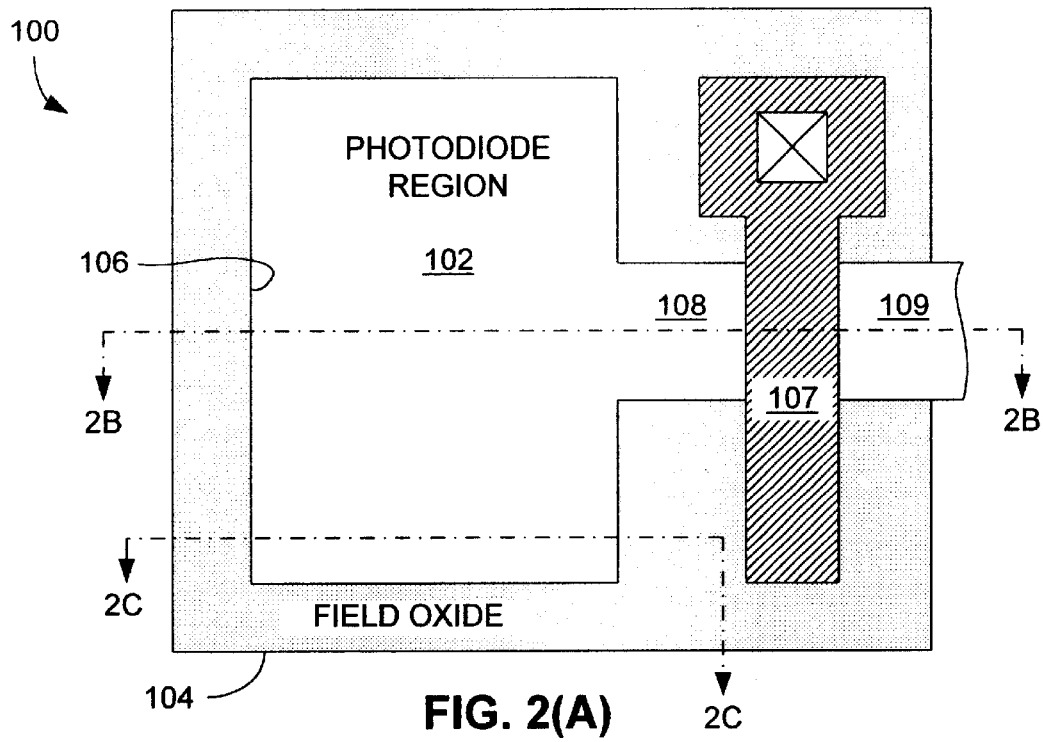
FIGS. 2(A) through 2(C) are plan and cross-sectional views showing a portion of a conventional CMOS photodiode.
Figure 2B:
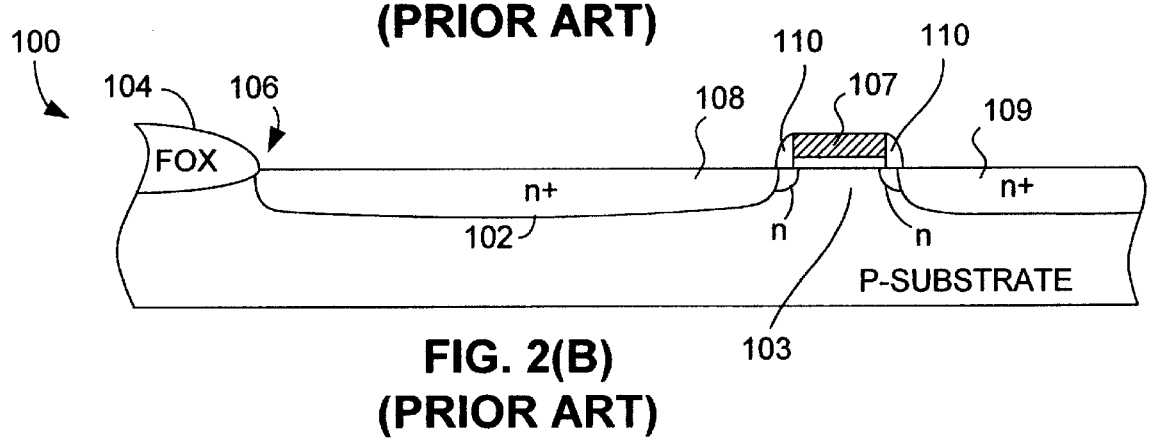
Figure 2C:
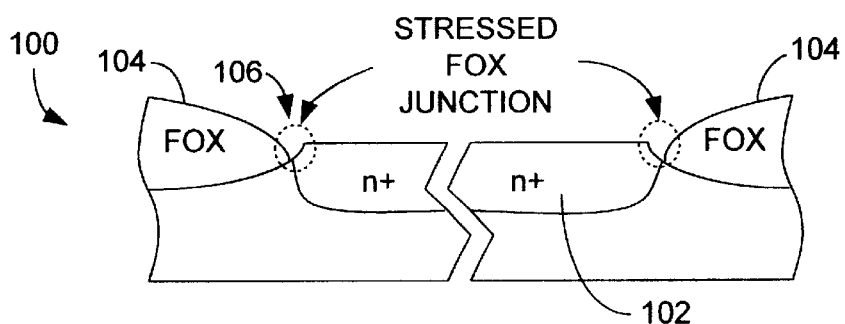

For example, referring to FIG. 2(C), while etching the LDD spacer material to form sidewall spacers 108, the present inventor believes the plasma etching process can induce further damage to portions of interface 106 between field oxide 104 and photodiode region 102. As a result, regions that are already initially stressed from the LOCOS process suffer from additional stress and damage. When subjected to electrical fields during operation, this stress/damage results in high leakage currents from photodiode region 102. Other forms of field oxide stress are discussed in co-owned U.S. Pat. No. 6,177,293 issued Jan. 23, 2001 entitled "METHOD AND STRUCTURE FOR MINIMIZING WHITE SPOTS IN CMOS IMAGE SENSORS", which is incorporated herein by reference in its entirety.

The present invention is directed to structures and methods for producing "fieldless" CMOS image sensors that avoid the leakage currents produced in conventional CMOS APS pixels by isolating the image-sensing (e.g., photodiode) region of each pixel with a non-LOCOS, low stress isolation structure. As used herein, the term "fieldless" denotes a non-LOCOS isolation structure surrounding the image-sensing region of each pixel. This term does not preclude the use of LOCOS isolation structures in portions of the CMOS image sensors located away from the image-sensing region of the pixels. In accordance with an embodiment of the present invention, instead of a LOCOS field oxide, a spacer oxide layer is patterned using a special blocking mask to form an oxide barrier around the image-sensing region of each pixel. This oxide barrier is used in conjunction with an anti-punchthrough (APT) implant to isolate the image-sensing region of each pixel. As used herein, the phrase "oxide barrier" denotes an oxide that is deposited (as opposed to grown) over the peripheral edge of the image-sensing region of each pixel. In contrast, conventional CMOS APS cell 100 includes the LOCOS-based (grown) field oxide 104 isolation structure that shares interface 106 with image-sensing region 102 (see FIG. 2(A). When the disclosed non-LOCOS isolation structures and CMOS APS fabrication methods are utilized to produce CMOS APS image sensors using submicron (e.g., 0.5 $\mu$m) CMOS processes, the effect is a significant reduction in leakage current from the light sensitive regions, thereby decreasing the occurrence of white spots.

The present invention is described below with reference to CMOS active-pixel sensors (APSs) that utilize photodiode light sensitive regions. However, the methods and structures described below may also be used to produce CMOS APSs utilizing photogate light sensitive regions. In addition, the methods and structures may be used to produce CMOS APSs having any number of transistors (e.g., one, three, four or five).

Figure 3A:
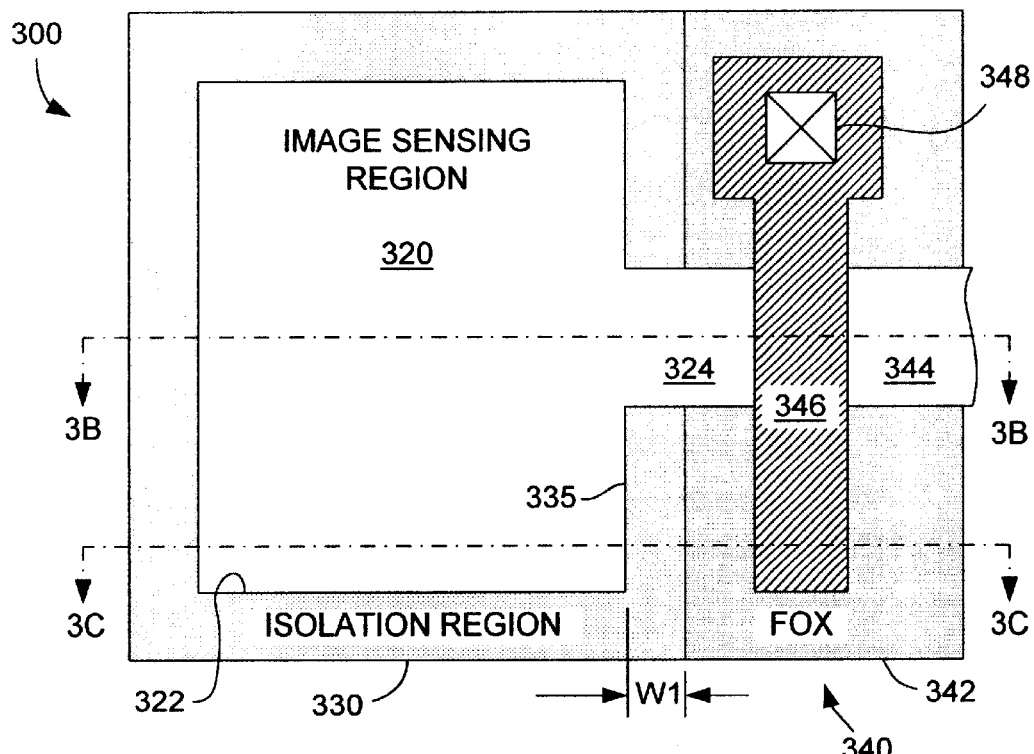
FIG. 3(A) is a plan view showing a portion of a CMOS APS cell in accordance with an embodiment of the present invention.
Figure 3B:
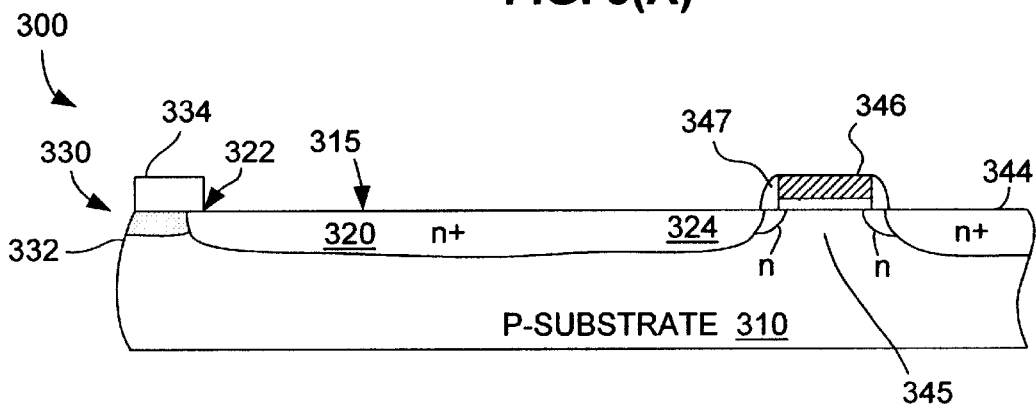
FIGS. 3(B) and 3(C) are cross-sectional side views taken along section lines 3B—3B and 3C—3C, respectively, of FIG. 3(A)
Figure 3C:
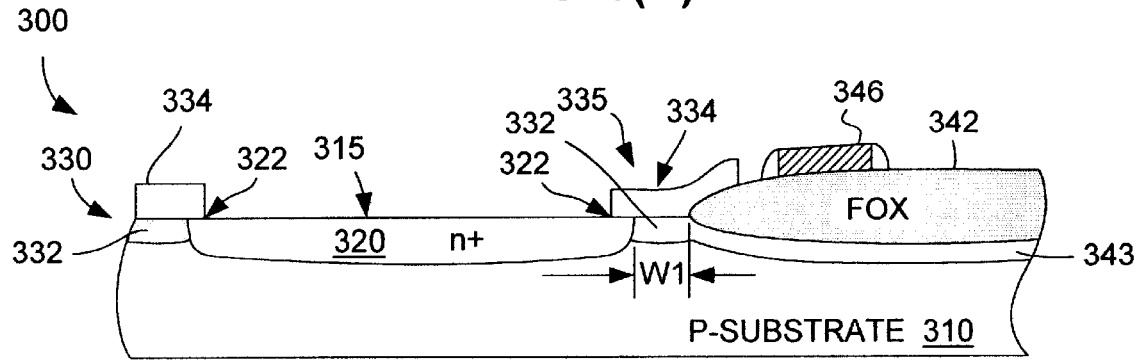

FIGS. 3(A), 3(B) and 3(C) are a plan and cross-sectional views, respectively, showing a pixel 300 of a fieldless CMOS image sensor fabricated in accordance with a first embodiment of the present invention. Pixel 300 is fabricated on a p-type substrate 310 that has an upper surface 315. Pixel 300 includes an n-type image-sensing (e.g., photodiode) region 320, an isolation structure 330 surrounding image-sensing region 320, and an active circuit 340 that includes polysilicon reset gate 346.

Image-sensing region 320 is an n-type diffusion region extending into substrate 310 that is implanted through upper surface 315 and is defined by a peripheral edge 322. In one embodiment, image-sensing region 320 covers an area of, for example, approximately 2 $\mu m^2$. A narrow n-type source region 324 extends from image-sensing region 320 into active circuit 340. A lightly-doped (n) portion of n-type source region 324 extends under polysilicon reset gate 346.

Isolation structure 330 is formed around image-sensing region 320 and extends over (abuts) peripheral edge 322. In one embodiment, isolation structure 330 includes an isolation (field) implant region 332 diffused into substrate 310, and an oxide barrier 334 that includes one or more oxide portions deposited on upper surface 315 over implant region 332. Isolation implant region 332 is, for example, an anti punchthrough (APT) implant that includes a conventional anti-punchthrough implant, a threshold voltage adjust implant and a PLDD implant. Oxide barrier 334 includes, for example, spacer oxide deposited on upper surface 315 and shielded during LDD spacer etchback by a special mask. Isolation structure 330 includes a portion 335 located between image-sensing region 320 and active circuit region 340 that has a minimum width W1 of 0.5 $\mu$m, thereby providing a region of relatively low stress between image-sensing region 320 and the LOCOS-based field oxide used in active circuit region 340.

Active circuit region 340 includes one or more field oxide (FOX) regions 342, one or more diffusion regions, such as drain region 344, and one or more polysilicon structures and associated metal connections, such as polysilicon gate structure 346 and metal connection 348. As indicated in FIG. 3(B), polysilicon gate structure 346 extends over a channel region 345 that is located between source region 324 and drain region 344, and forms the gate of a reset transistor of active circuit 340. Polysilicon gate structure 346 includes sidewall spacers 347 that are formed using known techniques. In accordance with one aspect of the first embodiment, sidewall spacers 347 and oxide barriers 334 are formed from a common deposited spacer oxide layer.

Referring to FIG. 3(C), field oxide region 342 is formed over a field implant 343 using known techniques, and is spaced from image-sensing region 320 by the width W1 of isolation structure 330 (discussed above). A fieldless CMOS image sensor including an array of pixels 300 avoids the mechanical stress and damage produced at the interface between the field oxide and image-sensing region in prior art CMOS APS cells by depositing a non-LOCOS oxide isolation barrier 330 around peripheral edge 322 of image-sensing region 320. By avoiding the mechanical stress and damage that is present in conventional CMOS APS sensors that utilize LOCOS-based field oxide around the image-sensing regions, leakage current from light sensitive regions 320 is significantly reduced, thereby minimizing the occurrence of white spots.

Figure 4A:
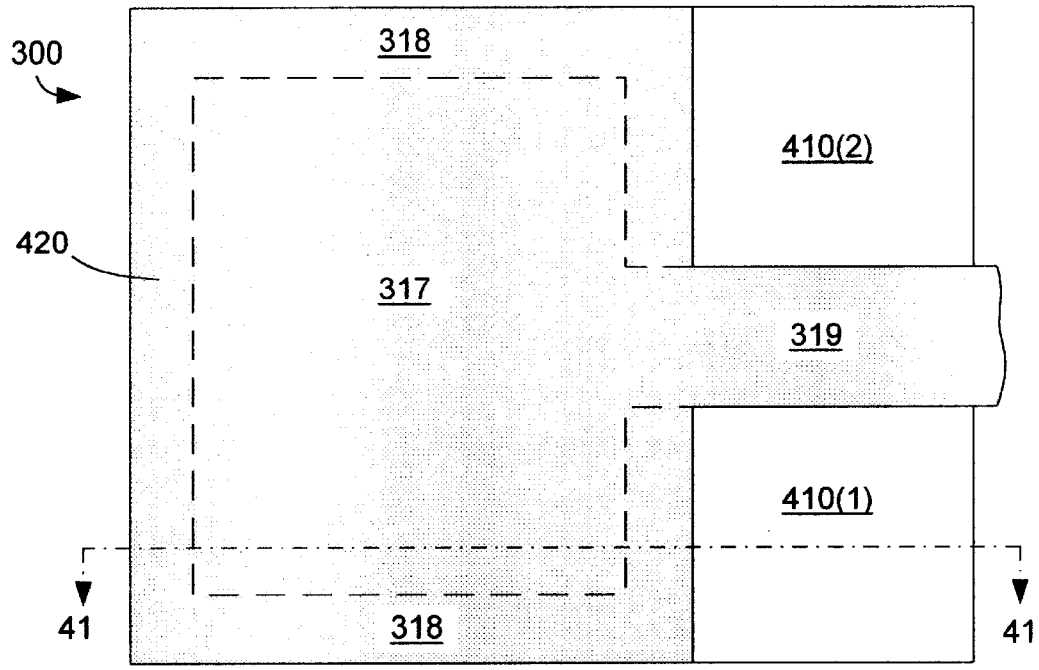
FIG. 4(A) is a plan view showing a partially-formed CMOS APS cell.
Figure 4B:
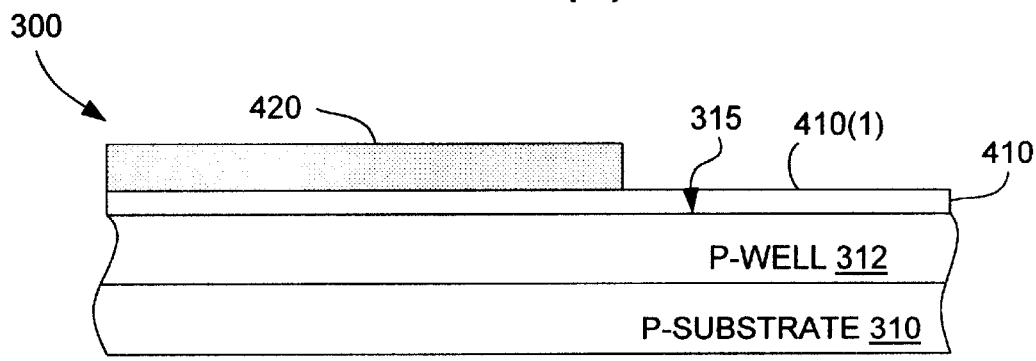
FIGS. 4(B) through 4(F) are cross-sectional side views taken along section line 41—41 of FIG. 4(A) illustrating successive process steps utilized in the formation of partial isolation implant regions in accordance with an aspect of the present invention.
Figure 4C:
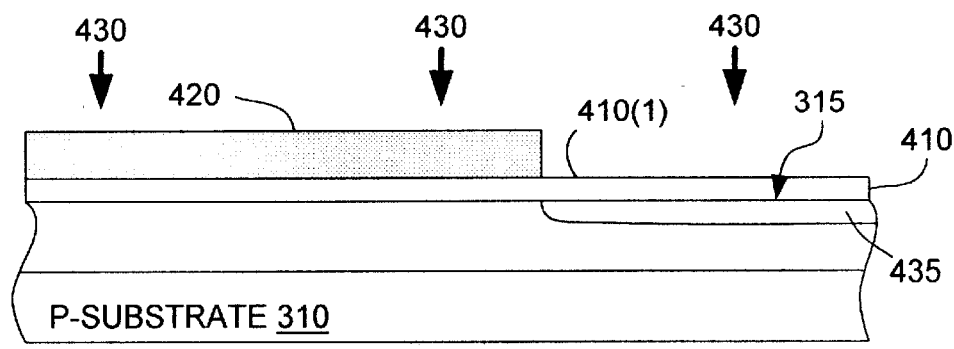
Figure 4D:
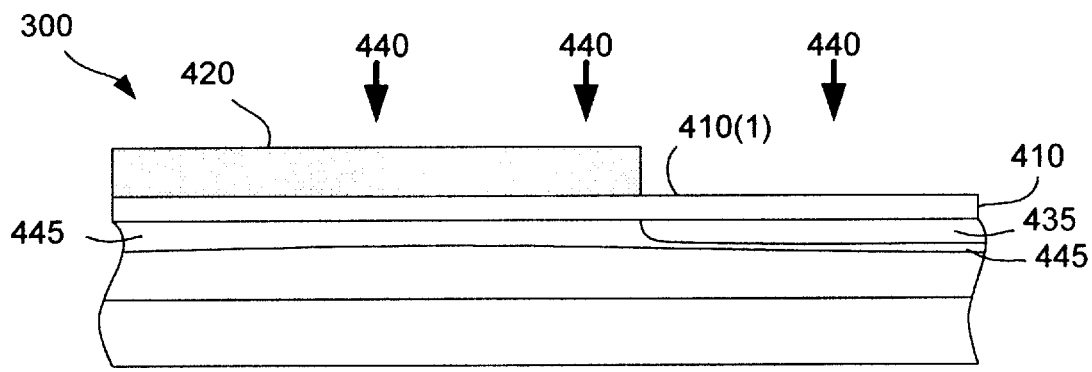
Figure 4E:
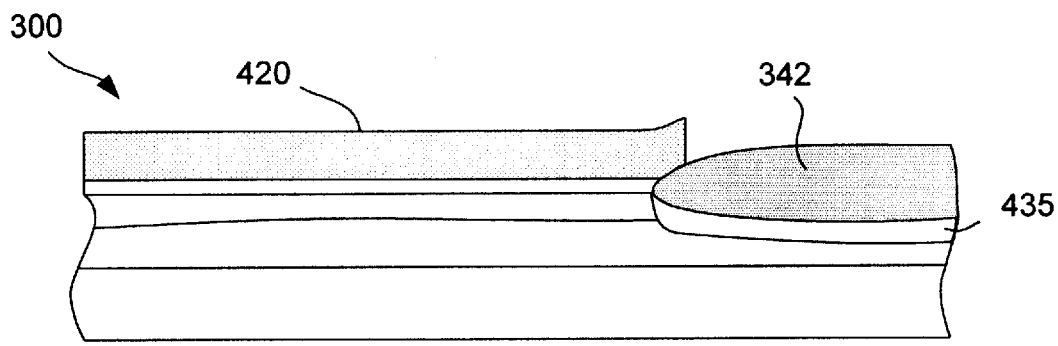
Figure 4F:
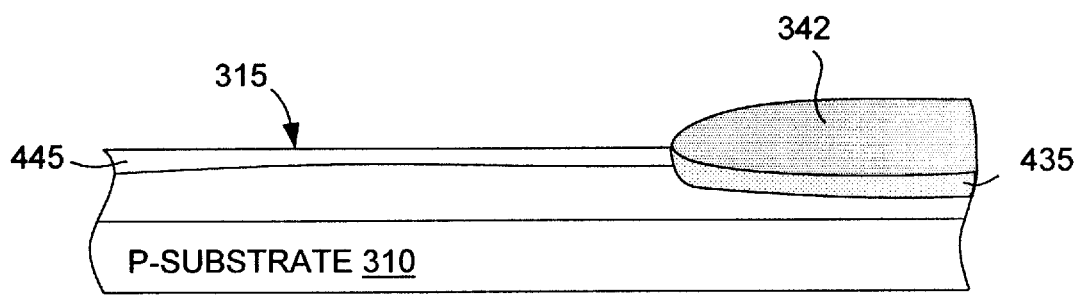
Figure 4G:
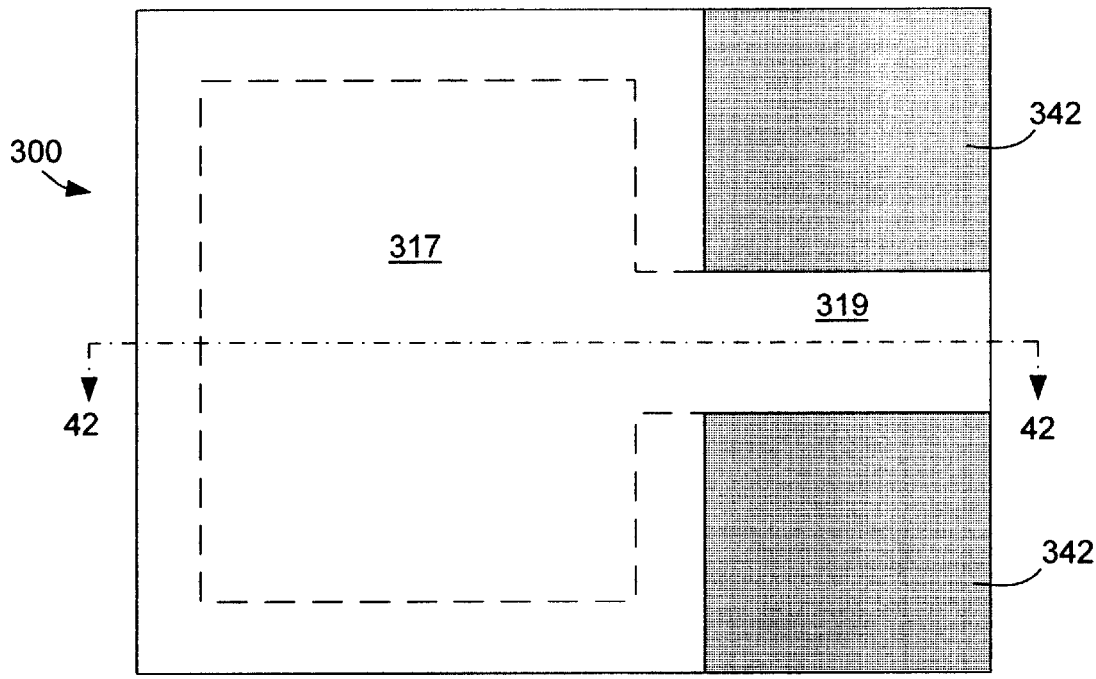
FIG. 4(G) is a plan view the CMOS APS cell of FIG. 4(A) after formation of field oxide regions.
Figure 4H:
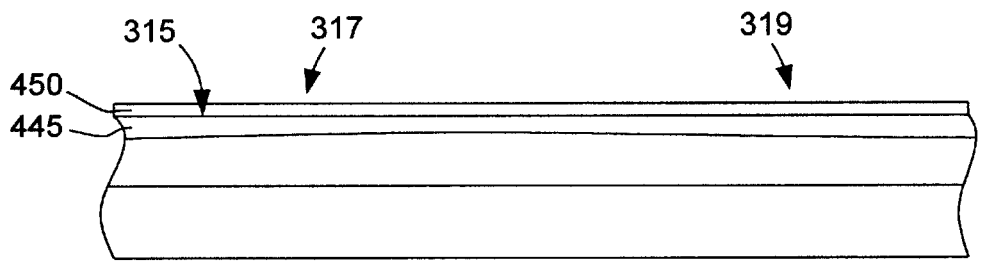
FIGS. 4(H) through 4(N) are cross-sectional side views taken along section line 42—42 of FIG. 4(G) illustrating successive process steps utilized in the formation of a polysilicon gate of the CMOS APS cell.
Figure 4I:
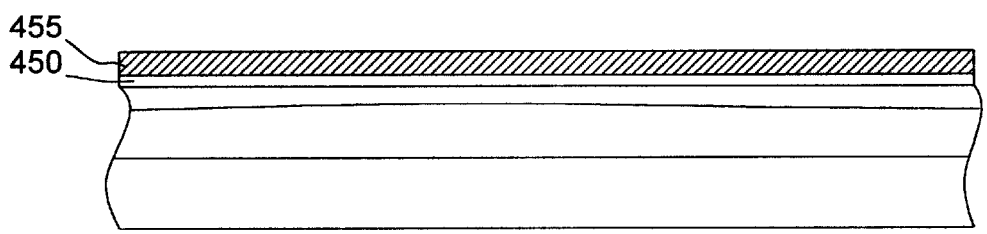
Figure 4J:
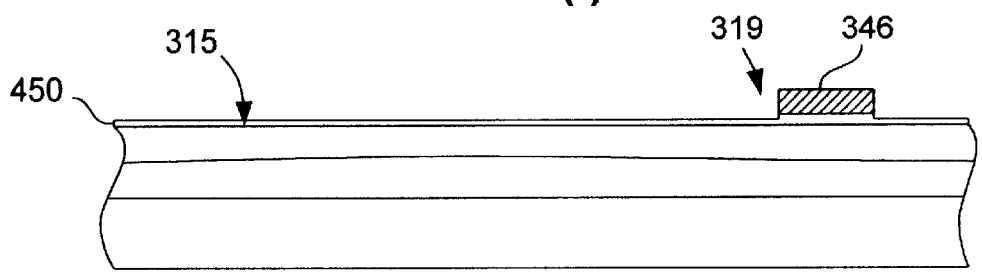
Figure 4K:
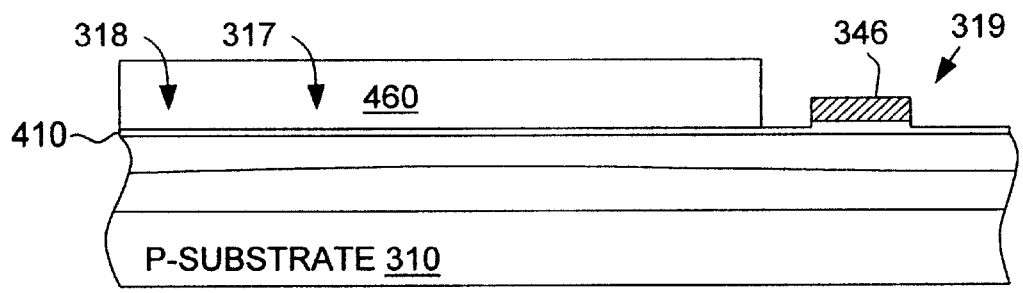
Figure 4L:
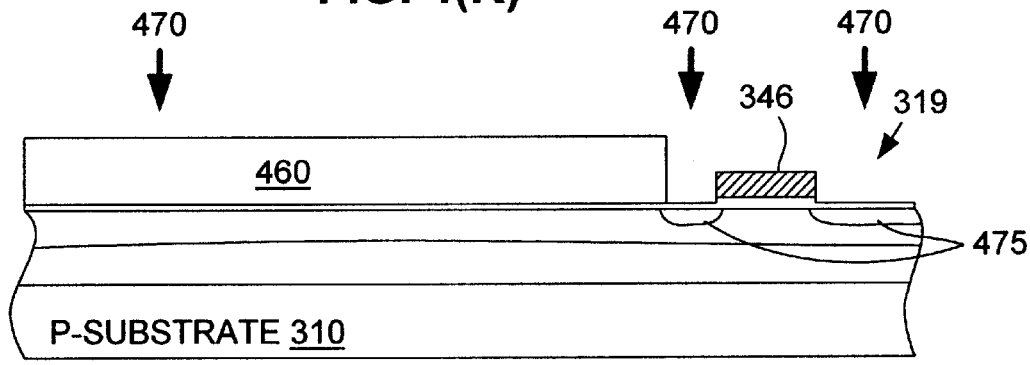
Figure 4M:
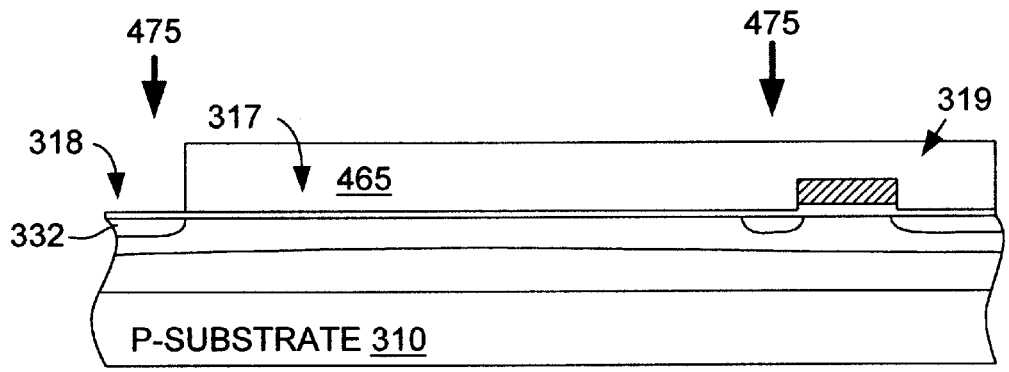
Figure 4N:
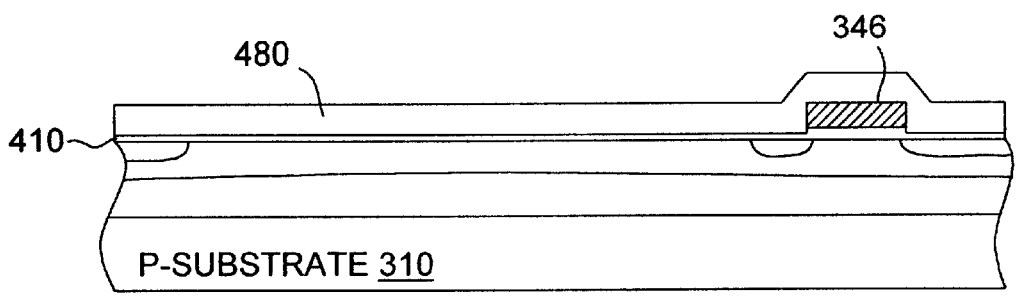
Figure 4O:
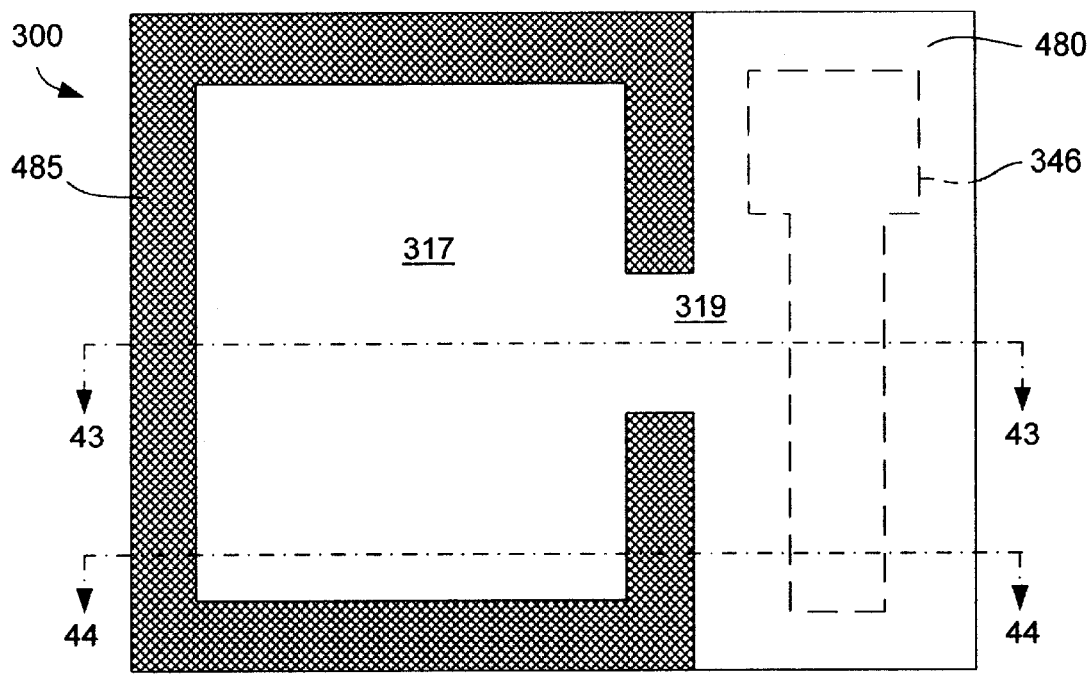
FIG. 4(O) is a plan view the CMOS APS cell of FIGS. 4(A) and 4(G) after the formation of a spacer oxide etch blocking mask in accordance with another aspect of the present invention.
Figure 4P:
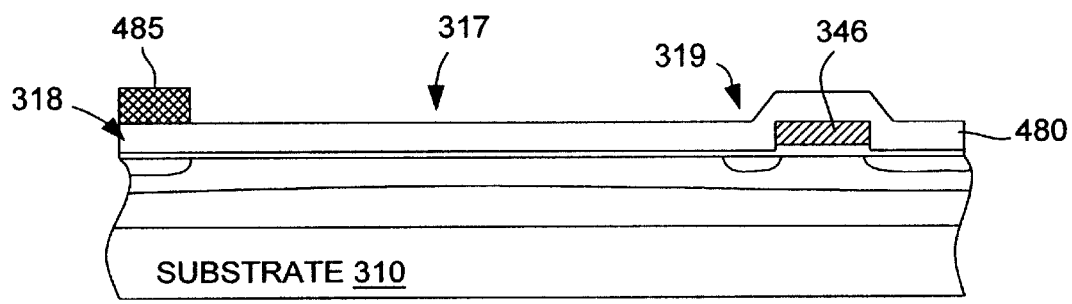
FIGS. 4(P) through 4(U) are cross-sectional side views taken along section lines 43—43 and 44—44 of FIG. 4(O) illustrating successive process steps utilized in the formation of a photodiode region of the CMOS APS cell.
Figure 4Q:
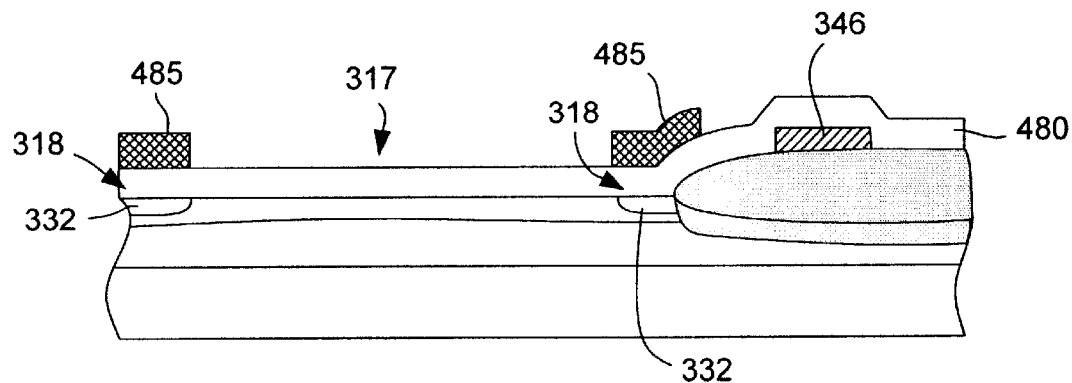
Figure 4R:
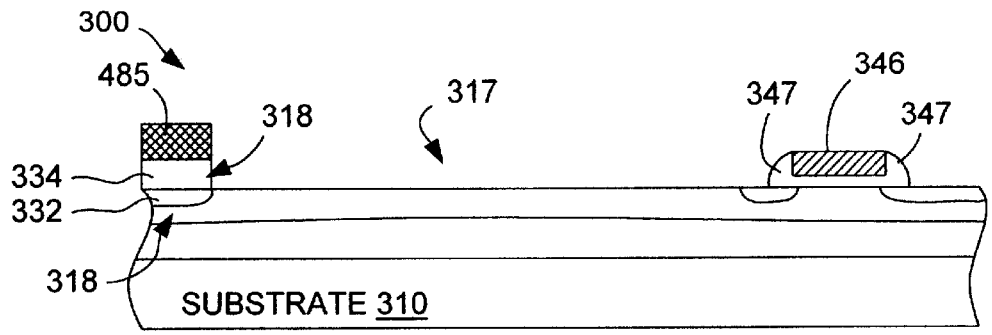
Figure 4S:
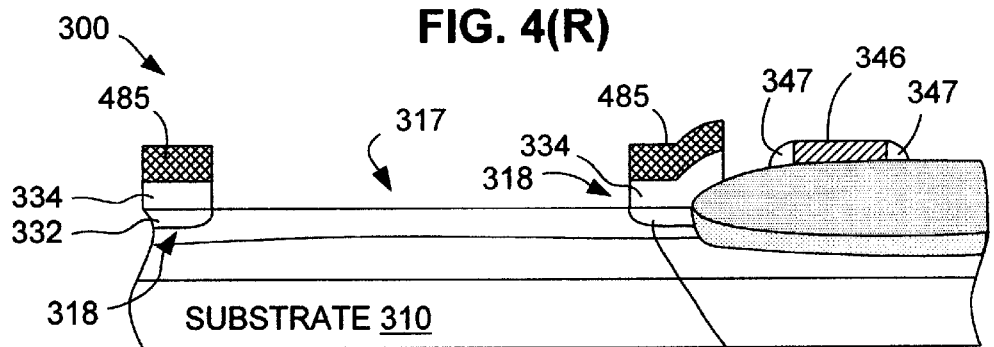
Figure 4T:
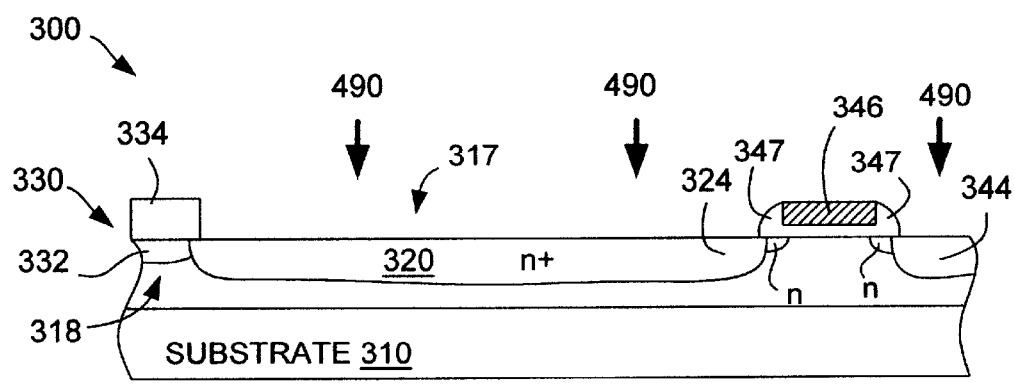
Figure 4U:
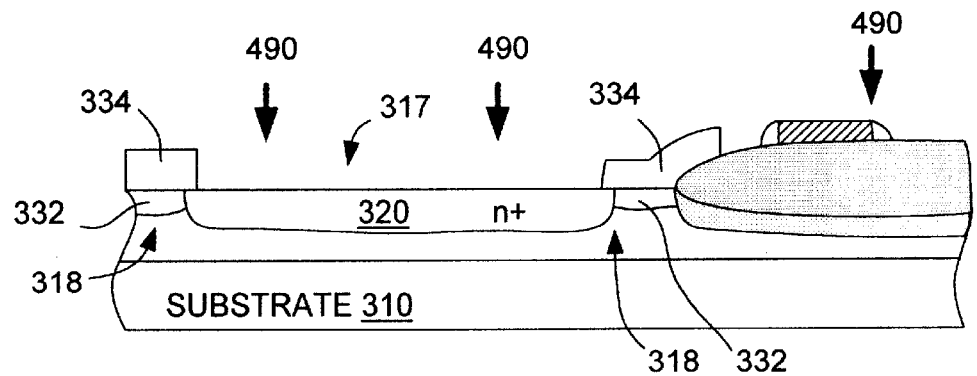

FIGS. 4(A) through 4(U) illustrate process steps associated with the formation of fieldless CMOS APS cell 300 in accordance with the first embodiment of the present invention. The process steps shown in these figures are simplified to selectively illustrate novel aspects of the present invention. Those of ordinary skill in the art will recognize that additional well-known process steps are necessary to generate CMOS image sensors. These additional process steps are omitted from the description for brevity.

FIG. 4(A) is a plan view of a substrate 310 including a pad oxide layer 410 (shown in FIG. 4(B)) and a silicon nitride ($Si_3N_4$) mask 420 formed thereon. FIG. 4(A) shows portions 410(1) and 410(2) of pad oxide layer 410 that are exposed through windows formed in $Si_3N_4$ mask 420. $Si_3N_4$ mask 420 is deposited and patterned using known LOCOS techniques to define regions in which field oxide is subsequently grown (i.e., in the areas associated with portions 410(1) and 410(2) of pad oxide layer 410).

$Si_3N_4$ mask 420 is formed over a central region 317 (which is associated with the image-sensing (photodiode) region of the pixel), a peripheral region 318 (indicated by dashed lines) surrounding central region 317, and a third region 319 extending from central region 317 between exposed portions 410(1) and 410(2) of pad oxide layer 410. In accordance with the present invention, the portion of Si₃N₄ mask 420 located over peripheral region 318 prevents the growth of LOCOS based field oxide around the periphery of central (image-sensing) region 317. In contrast, during the fabrication of conventional CMOS image sensors, a mask exposes the peripheral region surrounding the central region of each pixel to facilitate LOCOS-based field oxide growth around the central (image-sensing) region. As discussed in further detail below, in accordance with the present invention, a non-LOCOS isolation structure is formed in peripheral region 318 in place of the conventional LOCOS-based field oxide, thereby avoiding the stress/damage caused at the field oxide/photodiode interface in conventional CMOS image sensors. Third section 319 of Si₃N₄ mask 420, which is located between exposed portions 410(1) and 410(2), defines the source, drain and channel of the reset transistor of fieldless CMOS APS cell 300.

FIGS. 4(B) through 4(F) are cross-sectional views taken along section line 41—41 of FIG. 4(A) showing process steps associated with field oxide growth during the fabrication of fieldless CMOS APS cell 300.

Referring to FIG. 4(B), CMOS APS cell 300 is formed on a P-type substrate 310 that includes a P-well region 312 that is formed using known CMOS techniques. As is known to those skilled in the art of CMOS fabrication processes, P-well region 312 facilitates adjustment of the threshold voltage ($V_T$) of, for example, the reset transistor of CMOS APS cell 300. While P-well region 312 provides certain advantages over embodiments omitting this arrangement, it is not critical to the present invention and may be omitted. Pad oxide layer 410 is formed on the upper surface 315 of P-substrate 310 using known techniques. Similarly, the deposition and patterning of Si₃N₄ mask 420 is performed using well-known techniques.

As illustrated in FIG. 4(C), similar to conventional pixel fabrication processes, a P-type dopant 430 (e.g., boron) is implanted through the windows formed in Si₃N₄ mask 420 and through exposed pad oxide region 410(1) of pad oxide 410 to form P-type field implant region 435. This implant step is performed using low-energy techniques such that P-type field implant 435 is relatively shallow within P-substrate 310. Note that Si₃N₄ mask 420 blocks P-type dopant 430 from entering other regions of P-substrate 310.

Referring to FIG. 4(D), after formation of P-type field implant regions 435, a second implant step is performed during which a second P-type dopant 440 (e.g., boron) is implanted to form an anti-punchthrough (APT) region 445. This implant step is performed using high-energy techniques such that APT region 435 is implanted through Si₃N₄ mask 420 and pad oxide layer 410, and extends relatively deeply into P-substrate 310. Note that APT region 445 is formed over the entire area of CMOS APS cell 300.

FIG. 4(E) illustrates the growth of field oxide in field oxide regions 342 of pixel 300. The field oxide is formed over field implant region 435 using known LOCOS techniques. Referring briefly to FIG. 4(A), mask 420 is patterned to prevent growth of field oxide 342 over regions which correspond to the isolation structure that is located between image-sensing region 320 and field oxide region 342.

FIG. 4(F) illustrates the removal of Si₃N₄ mask 420 after the formation of field oxide regions 342. In addition to Si₃N₄ mask 420, the remaining portions of underlying pad oxide layer 410 (shown for reference in FIG. 4(E)) are also removed, thereby exposing upper surface 315 of substrate 310 in the central region 317, peripheral region 318 and third region 319 (see FIG. 3(A)).

FIG. 4 (G) is a plan view of partially formed CMOS APS cell 300 including field oxide regions 342. As illustrated in FIG. 4(G), field oxide regions 342 are separated from central (image-sensing) region 317 of P-substrate 310 by portions of peripheral region 318 (indicated by dashed lines). In addition, field oxide regions 342 are separated each other by third region 318 of P-substrate 310.

FIGS. 4(H) through 4(N) are cross-sectional views taken along section line 42—42 of FIG. 4(G) showing process steps associated with the formation of a polysilicon gate structure during the fabrication of fieldless CMOS APS cell 300. Referring to FIG. 4(H), a gate oxide layer 450 is deposited/grown on the upper surface 315 of substrate 310 using well-known techniques. Next, as illustrated in FIG. 4(I), a polysilicon layer 455 is then formed on the upper surface of gate oxide 450. Subsequently, as shown in FIG. 4(J), polysilicon layer 455 is etched through a mask using known techniques to form polysilicon reset gate 346 (see also FIG. 3(A)) that extends between field oxide regions 342 over third region 319 of substrate 310. Note that a portion of gate oxide 410 remains on upper surface 315 after the polysilicon etching process. Referring to FIG. 4(K), a photoresist NLDD blocking mask 460 is coated and patterned on gate oxide 410 over central region 317 and peripheral region 318 of substrate 310. Note that third region 319 of substrate 310 is exposed through a window defined by NLDD blocking mask 460. Subsequently, as shown in FIG. 4(L), an N-type LDD material 470 is implanted into third region 319 of substrate 310 using field oxide regions 342 (see FIG. 4(G) and polysilicon reset gate 346 for alignment. The implanted N-type LDD material 470 forms LDD regions 475 that extend under polysilicon reset gate 346. As indicated in FIG. 4(M), NLDD blocking mask 460 is then removed from substrate 310, and a photoresist PLDD blocking mask 465 is then coated and patterned on gate oxide 410 over central region 317 and third region 319 of substrate 310. Note that peripheral region 318 of substrate 310 is exposed through a window defined by PLDD blocking mask 465. Subsequently, a P-type material 475 is implanted into peripheral region 318 of substrate 310 that combines with existing APT implant dopants to form isolation implant region 332. As indicated in FIG. 4(N), PLDD blocking mask 465 is then removed, and a spacer oxide layer 480 having a thickness in the range of 1800 to 2000 Å is then deposited on gate oxide layer 410 and polysilicon reset gate 346 using known techniques.

FIG. 4(O) is a plan view of partially-formed CMOS APS cell 300 including spacer oxide layer 480 formed over polysilicon gate structure 346 (indicated by dashed lines). In accordance with another aspect of the first embodiment, a blocking mask 485 is formed on spacer oxide layer 480 generally in a "C" shape, with the open end of the "C" being aligned with the third region 319 of P-substrate 310. Mask 485 is formed on spacer oxide layer 480 over isolation implant region 332 using photoresist and known techniques.

FIGS. 4(P) and 4(Q) are cross-sectional views taken along section lines 43—43 and 44—44, respectively, of FIG. 4(O). These figures show spacer oxide layer 480 deposited over substrate 310 and polysilicon gate structure 346, and mask 485 formed over spacer oxide layer 480. Mask 485 is patterned such that it covers peripheral portions of spacer oxide layer 480 that are located over peripheral region 318 of substrate 310, in which is located isolation implant region 332. Mask 485 is also patterned such that it defines a central opening that exposes a central portion of spacer oxide layer 480 located over central region 317 of substrate 310.

FIGS. 4(R) and 4(S) are cross-sectional views taken along section lines 43—43 and 44—44, respectively, of FIG. 4(O), showing a step of etching (removing) the central portion of spacer oxide layer 480 to expose central portion 317 of substrate 310. During this etching process, mask 485 prevents removal of the peripheral portions of the oxide layer 480 that are located over peripheral region 318 and isolation implant region 332, thereby forming oxide barrier 334 around exposed central region 317. In accordance with the first embodiment, this removing step occurs during an etchback process during which sidewall spacers 347 are formed along the sides of polysilicon gate structure 346.

FIGS. 4(T) and 4(U) are cross-sectional views taken along section lines 43—43 and 44—44, respectively, of FIG. 4(O), showing a doping process during which a heavy (n+) dopant 490 is implanted in substrate 310 to form image-sensing region 320, source region 324 and drain region 344. This implant step utilizes oxide barrier 334 to define the outer periphery of image-sensing region 320 and the inner periphery of implant region 332. In effect, implant region 332 becomes self-aligned to oxide barrier 334 during this heavy (n+) doping process. This self-alignment is achieved by using a dose of n+ dopant that is much heavier than doses used in previous steps (described above), thereby counteracting previously implanted p-type dopants that are located in exposed central region 317 of substrate 310. Further, the lateral diffusion of the n+ dopant, in effect, moves the metallurgical junction between implant region 332 and image-sensing region 320 to the relatively undamaged silicon located in peripheral region 318 of substrate 310, which is located under the non-etched oxide spacer material of oxide barrier 334. By moving this metallurgical junction to the relatively undamaged silicon located in peripheral region 318, leakage current from image-sensing region 320 is minimized, thereby improving the performance of CMOS pixel 300. When this heavy doping implant step is completed, image-sensing region 320 is surrounded by fieldless isolation structure 330 including implant region 332, which is formed by isolation implant region 332 and oxide barrier 334 that is located over isolation implant region 332. After formation of image-sensing region 320, an oxide is deposited over pixel 300, and one or more metal layers are deposited and etched to form contact structures using known techniques.

Figure 5:
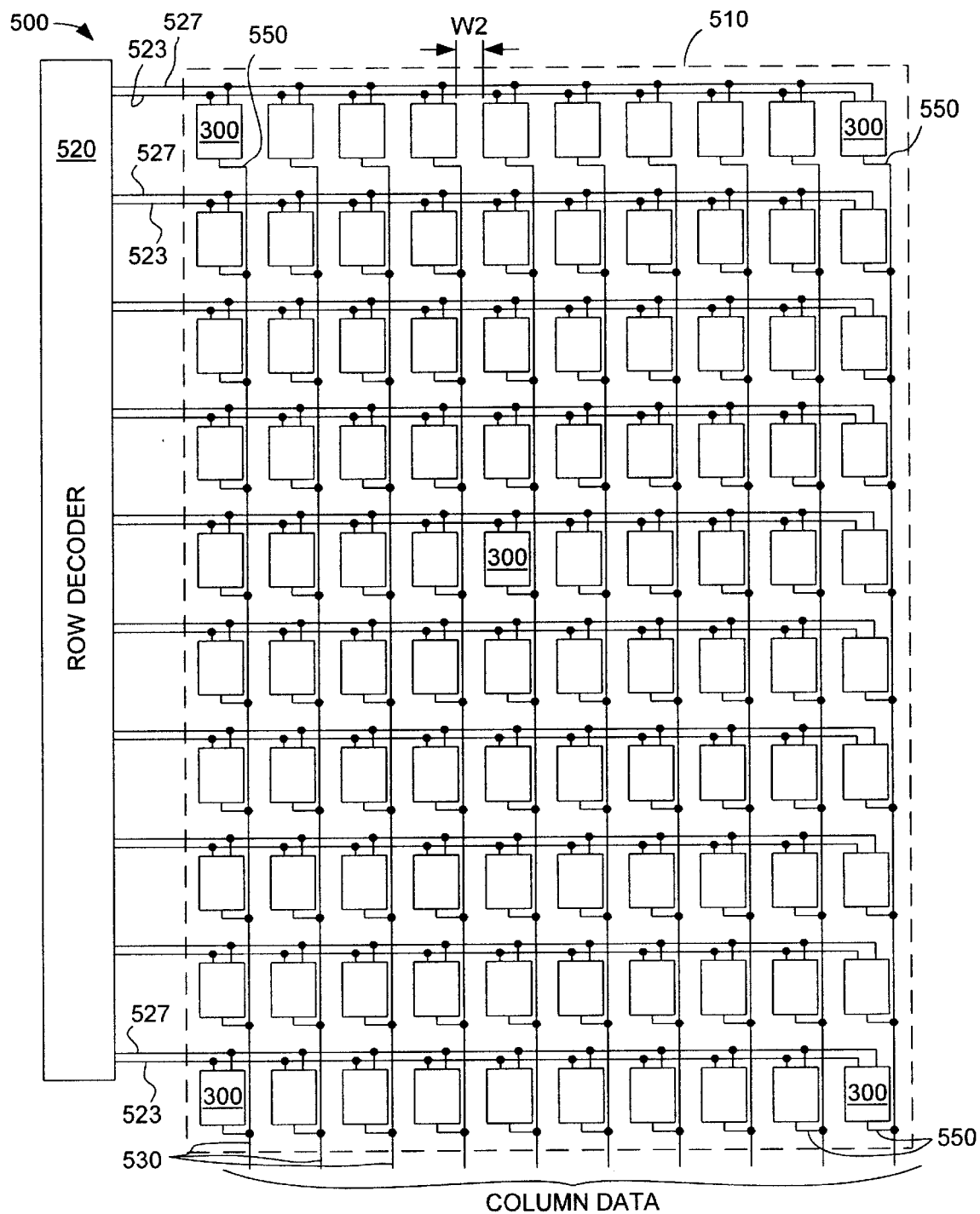
FIG. 5 is simplified circuit diagram showing a CMOS APS circuit according to the present invention.

FIG. 5 is a simplified circuit diagram showing a fieldless CMOS APS 500 that includes a pixel array 510, a row decoder 520 and a plurality of column data (bus) lines 530. Pixel array 510 includes closely spaced APS pixels 300 that are arranged in rows and columns. Each APS pixel 300 of pixel array 510 is formed in accordance with the methods and structures described above. The active circuits of pixels 300 in each row are connected to a common reset control line 523 and a common row select control line 527. Each reset control line 523 is connected to the reset gates of each pixel in one row of array 510. The active circuits of the pixels 300 in each column are connected through respective output terminals 550 to common column data lines 530. Operation of fieldless CMOS APS 500 is essentially the same as that described above with respect to prior art CMOS APS 10 (see Background section).

Figure 6:
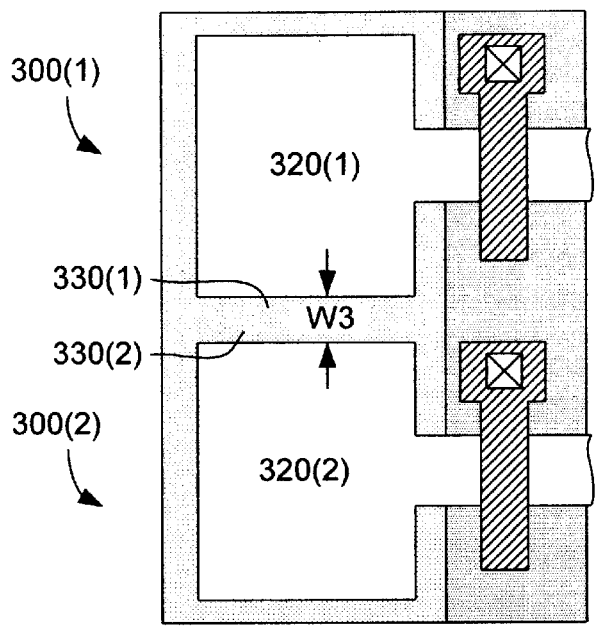
FIG. 6 is a plan view showing a portion of a pixel array of the CMOS photodiode array shown in FIG. 5.

FIG. 6 is a plan view showing a first pixel 300(1) and a second pixel 300(2) that are located adjacent to each other in pixel array 510 of fieldless CMOS APS 500 (see FIG. 5). First pixel 300(1) includes an image-sensing region 320(1) surrounded by an isolation structure that includes a section 330(1). Similarly, second pixel 300(2) includes an image-sensing region 320(2) surrounded by an isolation structure that includes a section 330(2). As indicated in FIG. 6, isolation structure sections 330(1) and 330(2) combine to form a single isolation structure having a width W3 that isolates image-sensing region 320(1) from image-sensing region 320(2). In accordance with another aspect of the present invention, the width W3 is 0.5 μm or greater.

Figure 7A:
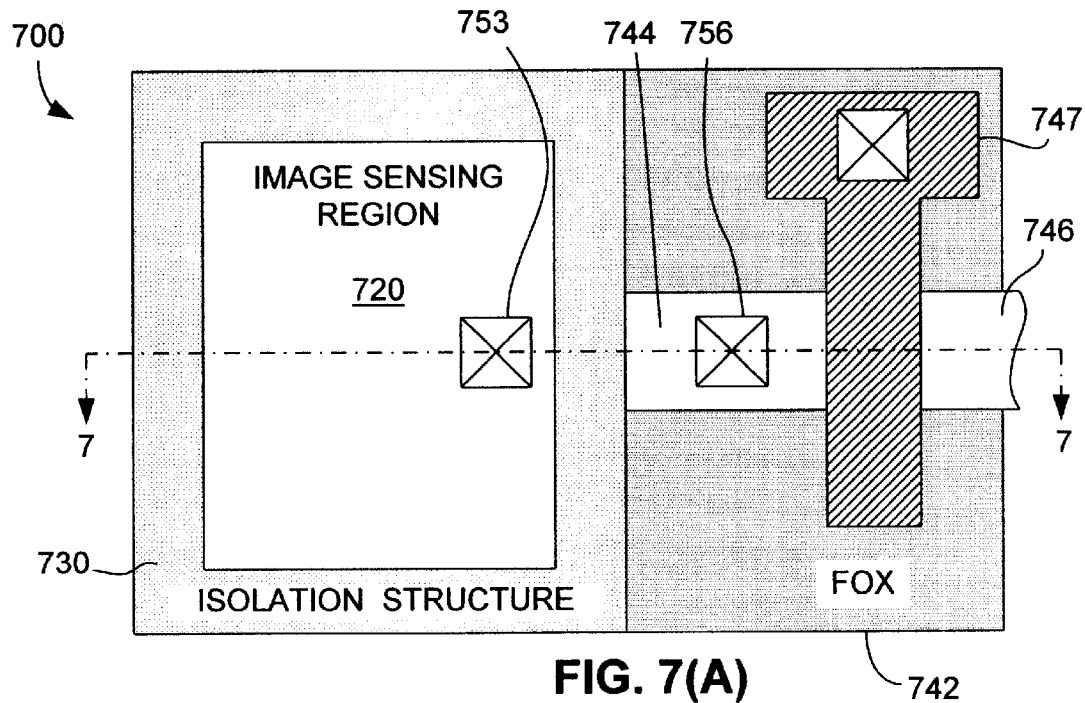
FIGS. 7(A) and 7(B) are plan and cross-sectional side views, respectively, showing a partial CMOS APS cell in accordance with another embodiment of the present invention.
Figure 7B:
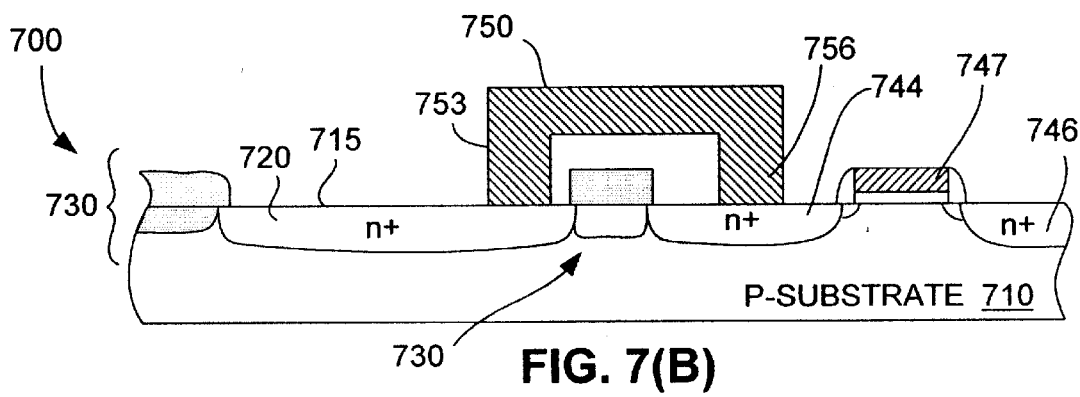

FIGS. 7(A) and 7(B) are plan and cross-sectional views, respectively, showing a pixel 700 of a fieldless CMOS image sensor fabricated in accordance with a second embodiment of the present invention. Pixel 700 is fabricated on a p-type substrate 710 that has an upper surface 715. Pixel 700 includes an n-type image-sensing (e.g., photodiode) region 720, an isolation structure 730 that surrounds image-sensing region 720, and an active circuit 740 including field oxide region 742, and a reset gate formed by a source region 744, a drain region 746 and a polysilicon gate 747. Similar to isolation structure 330 of the first embodiment, isolation structure 730 includes an implant (e.g., APT) region formed in substrate 710, and oxide material formed on upper surface over the implant region. Note that instead of "C" shaped mask 485 utilized in the fabrication of pixel 300 (see FIG. 4(O)), an essentially "O" shaped mask is used in the fabrication of pixel 700.

In accordance with the second embodiment, fieldless isolation structure 730 completely surrounds image-sensing region 720. Instead of the direct connection between source region 324 and image-sensing region 320 of the first embodiment (see FIG. 3 (A)), n-type source region 744 is separated from image-sensing region 720 by a portion of isolation structure 730, and a metal connector 750 is provided between a first contact 753 on image-sensing region 720 and a second contact 756 on source region 744. As in the first embodiment (described above), a fieldless CMOS image sensor including an array of pixels 700 completely avoids the mechanical stress and damage produced at the interface between the field oxide and image-sensing region in prior art CMOS APS cells by placing isolation structure 730, which does not include field oxide, completely around the peripheral edge of image-sensing region 720. By completely avoiding this mechanical stress and damage, leakage current from image-sensing region 720 is significantly reduced over that of prior art CMOS image sensors, thereby minimizing the occurrence of white spots.

Although the invention has been described in connection with several embodiments, it is understood that this invention is not limited to the embodiments disclosed, but is capable of various modifications which would be apparent to a person skilled in the art. For example, the isolation structure may comprise an implanted isolation region other than the APT regions described with respect to the disclosed embodiments. For example, the order of the process steps is not restricted to those disclosed in the above examples. Other modifications to the disclosed process and structures are also possible. Thus, the invention is limited only by the following claims.

What is claimed is:

1. A method of forming a fieldless CMOS image sensor fabricated on a substrate, the method comprising:

implanting a first dopant into the substrate, wherein the first dopant includes an anti-punchthrough material;

forming an oxide layer over the substrate;

forming a mask on the oxide layer such that the mask covers a peripheral portion of the oxide layer and defines a central opening through which a central portion of the oxide layer is exposed;

removing the central portion of the oxide layer to expose a portion of the substrate located in the central opening, wherein the mask prevents removal of the peripheral portion of the oxide layer, thereby forming an oxide barrier around the exposed substrate portion; and implanting a second dopant into the exposed substrate portion to form an image-sensing region that is surrounded by a fieldless isolation structure including an implant region formed by the implanted first dopant, and the oxide barrier that is located over the implant region.

2. The method according to claim 1, wherein the step of implanting the first dopant comprises implanting the anti-punchthrough material using a high energy process.

3. The method according to claim 1, wherein the step of forming the oxide layer further comprises:

forming a field oxide region on the substrate, the field oxide region having a peripheral edge; and depositing the oxide layer over the substrate such that a portion of the oxide layer extends over the peripheral edge of the field oxide region.

4. The method according to claim 3, wherein the step of forming the mask on the oxide layer further comprises patterning the mask to cover the portion of the oxide layer extending over the peripheral edge of the field oxide region.

5. The method according to claim 1, wherein the step of forming the mask comprises depositing and patterning photoresist.

6. The method according to claim 5, wherein the step of forming the mask further comprising forming the photoresist in a C-shaped pattern.

7. The method according to claim 5, wherein the step of forming the mask further comprising forming the photoresist in a O-shaped pattern.

8. A method of forming a fieldless CMOS image sensor fabricated on a substrate, the method comprising:

implanting a first dopant into the substrate;

forming an oxide layer over the substrate;

forming a mask on the oxide layer such that the mask covers a peripheral portion of the oxide layer and defines a central opening through which a central portion of the oxide layer is exposed;

removing the central portion of the oxide layer to expose a portion of the substrate located in the central opening, wherein the mask prevents removal of the peripheral portion of the oxide layer, thereby forming an oxide barrier around the exposed substrate portion; and implanting a second dopant into the exposed substrate portion to form an image-sensing region that is surrounded by a fieldless isolation structure including an implant region formed by the implanted first dopant, and the oxide barrier that is located over the implant region;

wherein the step of forming the oxide layer further comprises:

forming a field oxide region on the substrate, the field oxide region having a peripheral edge; and depositing the oxide layer over the substrate such that a portion of the oxide layer extends over the peripheral edge of the field oxide region, further comprising the step of forming a polysilicon gate structure on the field oxide region, wherein the step of depositing the oxide layer further comprises depositing a spacer oxide layer over the polysilicon gate structure, and wherein the step of removing the central portion of the oxide layer comprises etching the spacer oxide layer to form sidewall spacers abutting the polysilicon gate structure.

9. A method of forming a fieldless CMOS image sensor fabricated on a substrate, the method comprising:

implanting a first dopant into the substrate;

forming an oxide layer over the substrate;

forming a mask on the oxide layer such that the mask covers a peripheral portion of the oxide layer and defines a central opening through which a central portion of the oxide layer is exposed;

removing the central portion of the oxide layer to expose a portion of the substrate located in the central opening, wherein the mask prevents removal of the peripheral portion of the oxide layer, thereby forming an oxide barrier around the exposed substrate portion; and implanting a second dopant into the exposed substrate portion to form an image-sensing region that is surrounded by a fieldless isolation structure including an implant region formed by the implanted first dopant, and the oxide barrier that is located over the implant region, wherein the first dopant is a P-type dopant and the second dopant is an N-type dopant.

* * * * *